(12) United States Patent
Kamtekar et al.

(10) Patent No.: US 10,870,726 B2
(45) Date of Patent: Dec. 22, 2020

(54) POLYMER

(71) Applicants: Cambridge Display Technology Limited, Godmanchester (GB); Sumitomo Chemical Company Limited, Tokyo (JP)

(72) Inventors: Kiran Kamtekar, Godmanchester (GB); Florence Bourcet, Godmanchester (GB); Martina Pintani, Godmanchester (GB)

(73) Assignees: Cambridge Display Technology Limited, Godmanchester (GB); Sumitomo Chemical Company Limited, Tokyo (JP)

(*) Notice: Subject to any disclaimer, the term of this patent is extended or adjusted under 35 U.S.C. 154(b) by 368 days.

(21) Appl. No.: 16/063,635

(22) PCT Filed: Dec. 15, 2016

(86) PCT No.: PCT/GB2016/053950
§ 371 (c)(1),
(2) Date: Jun. 18, 2018

(87) PCT Pub. No.: WO2017/103597
PCT Pub. Date: Jun. 22, 2017

(65) Prior Publication Data
US 2018/0371156 A1 Dec. 27, 2018

(30) Foreign Application Priority Data
Dec. 18, 2015 (GB) .................................. 1522434.8

(51) Int. Cl.
*H01L 51/50* (2006.01)
*C08G 61/12* (2006.01)
(Continued)

(52) U.S. Cl.
CPC ........... *C08G 61/122* (2013.01); *C08G 61/12* (2013.01); *C09D 165/00* (2013.01); *C09K 11/06* (2013.01);
(Continued)

(58) Field of Classification Search
None
See application file for complete search history.

(56) References Cited

U.S. PATENT DOCUMENTS

2006/0284140 A1  12/2006  Breuning et al.
2012/0181520 A1   7/2012  Kim et al.
(Continued)

FOREIGN PATENT DOCUMENTS

EP   2 345 683 A1   7/2011
JP   2005-071909 A  3/2005
(Continued)

OTHER PUBLICATIONS

PCT/GB2016/053950, Mar. 6, 2017, International Search Report and Written Opinion.
(Continued)

*Primary Examiner* — Gregory D Clark
(74) *Attorney, Agent, or Firm* — Wolf, Greenfield & Sacks, P.C.

(57) ABSTRACT

A polymer comprising a repeat unit of formula (I): (I) wherein each $Ar^1$ and each $Ar^2$ independently represents a substituted or unsubstituted aromatic or heteroaromatic group; each Cy independently represents a saturated heterocyclic or carbocyclic ring that may be unsubstituted or substituted with one or more substituents; n is 1, 2 or 3; and adjacent groups $Ar^2$ may be linked by a divalent linking group in the case where n is 2 or 3. The polymer may be used as a charge-transporting material or light-emitting material in an organic light-emitting device.

(Continued)

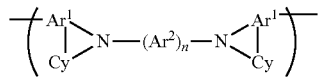

(I)

20 Claims, 1 Drawing Sheet

(51) Int. Cl.
*C09D 165/00* (2006.01)
*C09K 11/06* (2006.01)
*H01L 51/00* (2006.01)

(52) U.S. Cl.
CPC .... *H01L 51/0035* (2013.01); *C08G 2261/122* (2013.01); *C08G 2261/148* (2013.01); *C08G 2261/149* (2013.01); *C08G 2261/1412* (2013.01); *C08G 2261/314* (2013.01); *C08G 2261/3142* (2013.01); *C08G 2261/3245* (2013.01); *C08G 2261/344* (2013.01); *C08G 2261/411* (2013.01); *C08G 2261/512* (2013.01); *C08G 2261/5222* (2013.01); *C08G 2261/95* (2013.01)

(56) References Cited

U.S. PATENT DOCUMENTS

| | | |
|---|---|---|
| 2013/0146849 A1 | 6/2013 | Yang et al. |
| 2013/0284985 A1 | 10/2013 | Yoshida et al. |
| 2014/0346463 A1 | 11/2014 | Kim et al. |

FOREIGN PATENT DOCUMENTS

| | | | | |
|---|---|---|---|---|
| JP | 2006-077058 A | | 3/2006 | |
| KR | 2010047038 | * | 5/2012 | ............ H01L 51/50 |
| WO | WO 2006/096399 A2 | | 9/2006 | |
| WO | WO 2013/007966 A1 | | 1/2013 | |

OTHER PUBLICATIONS

GB1522434.8, Oct. 4, 2016, Combined Search and Examination Report.
International Search Report and Written Opinion for International Application No. PCT/GB2016/053950, dated Mar. 6, 2017.
Combined Search and Examination Report for British Application No. 1522434.8, dated Oct. 4, 2016.

* cited by examiner

POLYMER

RELATED APPLICATIONS

This application is a national stage filing under 35 U.S.C. 371 of International Patent Application Serial No. PCT/GB2016/053950, filed Dec. 15, 2016 which claims priority to United Kingdom application number GB 1522434.8, filed Dec. 18, 2015, each of which is incorporated herein by reference in their entirety.

FIELD OF THE INVENTION

The present invention relates to polymers, in particular charge transporting and/or light-emitting polymers; monomers for making said polymers; methods of making said polymers; compositions containing said polymers; organic electronic devices comprising said polymers; and methods of making said devices.

BACKGROUND OF THE INVENTION

Electronic devices containing active organic materials are attracting increasing attention for use in devices such as organic light emitting diodes (OLEDs), organic photoresponsive devices (in particular organic photovoltaic devices and organic photosensors), organic transistors and memory array devices. Devices containing active organic materials offer benefits such as low weight, low power consumption and flexibility. Moreover, use of soluble organic materials allows use of solution processing in device manufacture, for example inkjet printing or spin-coating.

An OLED may comprise a substrate carrying an anode, a cathode and one or more organic light-emitting layers between the anode and cathode.

Holes are injected into the device through the anode and electrons are injected through the cathode during operation of the device. Holes in the highest occupied molecular orbital (HOMO) and electrons in the lowest unoccupied molecular orbital (LUMO) of a light-emitting material combine to form an exciton that releases its energy as light.

Suitable light-emitting materials include small molecule, polymeric and dendrimeric materials. Exemplary light-emitting polymers include poly(arylene vinylenes) such as poly (p-phenylene vinylenes) and polyarylenes such as polyfluorenes.

WO 2005/049546 discloses polymers having a repeat unit of formula:

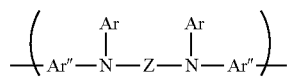

wherein Ar is a substituted or unsubstituted aryl group, Ar" is a substituted or unsubstituted arylene group and Z is a polycyclic arylene.

US 2011/0175072 discloses an OLED including an emitting layer doped with an iridium complex and with a compound of formula:

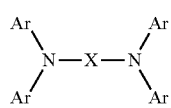

wherein Ar is aryl and X is an arylene group, for example phenylene, biphenylene and spirofluorenylene.

US 2004/109955 discloses repeat units having the following formula:

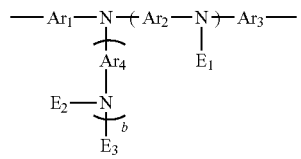

wherein Ar1, Ar2, Ar3 and Ar4 each independently represent an arylene group or divalent heterocyclic group; E1, E2 and E3 each independently represent an aryl group which has three or more substituents selected from certain substituents or a heterocyclic group which has one or more substituents selected from certain substituents, a and b each independently represent 0 or 1 and $0 \leq a+b \leq 1$.

It is an object of the invention to provide charge-transporting and light-emitting polymers having improved performance.

It is a further object of the invention to provide an blue light-emitting polymer having high efficiency.

SUMMARY OF THE INVENTION

In a first aspect the invention provides a polymer comprising a repeat unit of formula (I):

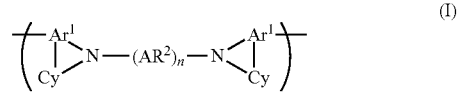

wherein each $Ar^1$ and each $Ar^2$ independently represents a substituted or unsubstituted aromatic or heteroaromatic group; each Cy independently represents a saturated heterocyclic or carbocyclic ring that may be unsubstituted or substituted with one or more substituents; n is 1, 2 or 3; and adjacent groups $Ar^2$ may be linked by a divalent linking group in the case where n is 2 or 3.

In a second aspect the invention provides a monomer of formula (III):

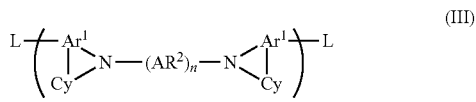

wherein $Ar^1$, $Ar^2$, Cy and n are as defined in the first aspect and each L represents a reactive leaving group.

In a third aspect the invention provides a method of forming a polymer according to the first aspect, the method comprising the step of polymerising a monomer according to the second aspect.

In a fourth aspect the invention provides an organic electronic device comprising a semiconductor layer wherein the semiconductor layer comprises a polymer according to the first aspect.

In a fifth aspect the invention provides a formulation comprising a polymer according to the first aspect and at least one solvent.

In a sixth aspect the invention provides a method of forming an organic electronic device according to the fourth aspect, the method comprising the step of forming the semiconducting layer by depositing the formulation of the fifth aspect and evaporating the at least one solvent.

"aromatic group" and "heteroaromatic group" includes monocyclic or polycyclic aromatic and heteroaromatic groups, respectively.

DESCRIPTION OF THE DRAWINGS

The invention will now be described in more detail with reference to the drawings in which.

DETAILED DESCRIPTION OF THE INVENTION

Figure 1:
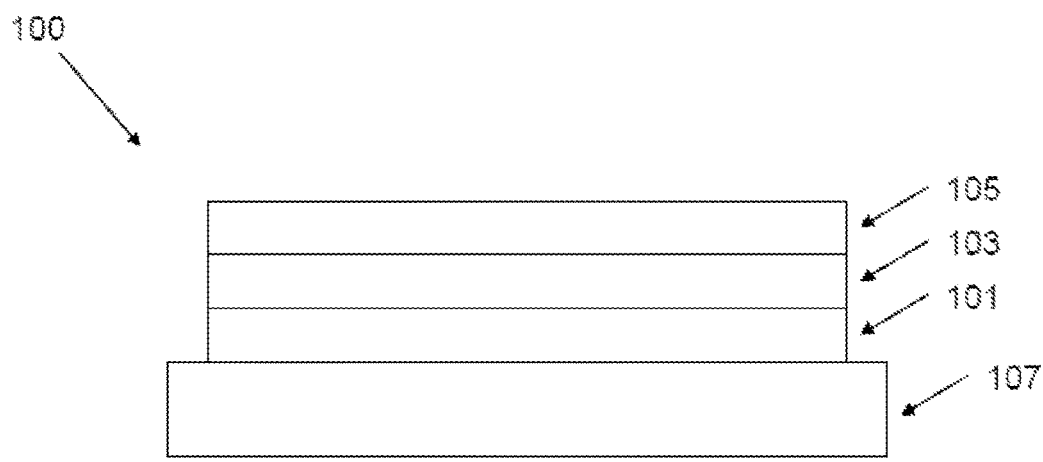
FIG. 1 illustrates schematically an OLED according to an embodiment of the invention.

FIG. 1, which is not drawn to any scale, illustrates schematically an OLED 100 according to an embodiment of the invention. The OLED 100 is carried on substrate 107 and comprises an anode 101, a cathode 105 and a light-emitting layer 103 between the anode and the cathode. Further layers (not shown) may be provided between the anode and the cathode including, without limitation, hole-transporting layers, electron-transporting layers, hole-blocking layers, electron-blocking layers, hole-injection layers and electron-injection layers.

Exemplary OLED structures including one or more further layers include the following:

Anode/Hole-injection layer/Light-emitting layer/Cathode

Anode/Hole transporting layer/Light-emitting layer/Cathode

Anode/Hole-injection layer/Hole-transporting layer/Light-emitting layer/Cathode

Anode/Hole-injection layer/Hole-transporting layer/Light-emitting layer/Electron-transporting layer/Cathode.

Preferably, a hole-transporting layer is provided between the anode and the light-emitting layer.

Preferably, a hole-injection layer is provided between the anode and the light-emitting layer, more preferably between the anode and a hole-transporting layer.

The polymer comprising a repeat unit of formula (I) may be provided in a light-emitting layer and/or in a hole-transporting layer. Preferably, the polymer comprising a repeat unit of formula (I) is provided in at least a light-emitting layer. The light-emitting layer may consist of the polymer or may comprise one or more further materials.

If used in a light-emitting layer, the polymer comprising a repeat unit of formula (I) may emit light, preferably blue light, when the device is in use or may be a host for a fluorescent or phosphorescent dopant.

The polymer may be a homopolymer, or may be a copolymer comprising a repeat unit of formula (I) and one or more further co-repeat units. In the case of a copolymer, the molar percentage of repeat units of formula (I) may be in the range of 0.5-25 mol %, optionally 1-10 mol %.

In the case where n is 2 or 3 and adjacent groups $Ar^2$ are linked by a divalent linking group, the divalent linking group is optionally selected from $C_{1-10}$ alkylene and a saturated monocyclic or polycyclic carbocyclic ring that may be unsubstituted or substituted with one or more substituents ($C_{1-10}$ "alkylene" as used herein means a divalent carbon atom or alkyl chain). Optionally, substituents of the monocyclic or polycyclic ring (if present) are selected from substituents $R^1$ wherein $R^1$ in each occurrence is independently selected from alkyl, optionally $C_{1-20}$ alkyl, wherein one or more non-adjacent C atoms may be replaced with unsubstituted or substituted aryl or heteroaryl, O, S, substituted N, C=O or —COO—, and one or more H atoms may be replaced with F. An unsubstituted or substituted aryl or heteroaryl may be phenyl that may be unsubstituted or substituted with one or more substituents, optionally one or more $C_{1-20}$ alkyl groups. Substituents $R^1$ selected from $C_{1-20}$ alkyl are preferred.

If present, substituents of $Ar^2$ are optionally selected from substituents $R^2$ wherein $R^2$ in each occurrence is independently selected from alkyl, optionally $C_{1-20}$ alkyl, wherein one or more non-adjacent C atoms may be replaced with optionally substituted aryl or heteroaryl, O, S, substituted N, C=O or —COO—, and one or more H atoms may be replaced with F.

Preferably, each $Ar^2$ is independently phenylene, naphthylene or anthracene that may be unsubstituted or substituted with one or more substituents.

In the case where n is 3, only two of the adjacent $Ar^2$ groups may be linked by a divalent linking group, or each $Ar^2$ group may be linked to an adjacent $Ar^2$ group.

Preferably, n is 2.

Preferably, —$(Ar^2)$n— is a group of formula (IIa)-(IIe), more preferably (IIa):

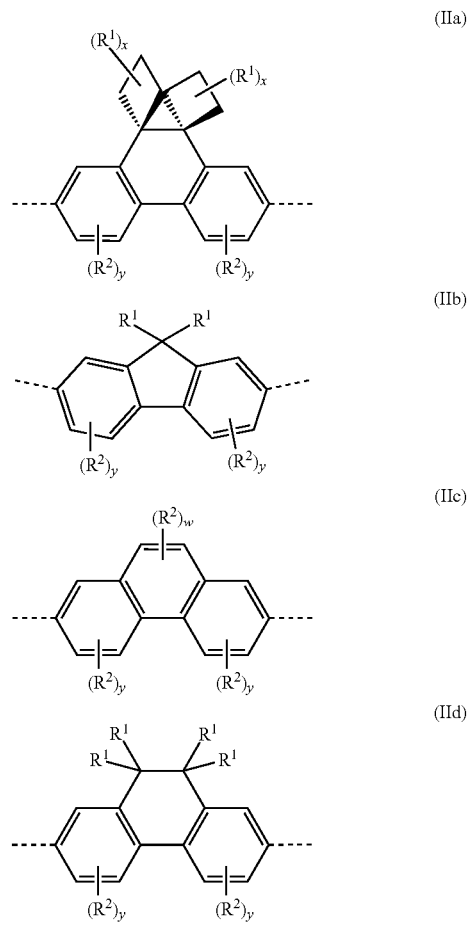

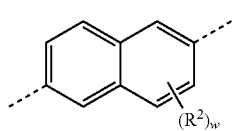

wherein each x is independently 0, 1, 2 or 3, preferably 0 or 1; y in each occurrence is independently 0, 1, 2 or 3, preferably 0; w is 0, 1 or 2, preferably 1 or 2; and — represents a bond to N of formula (I).

Preferably, Cy is a saturated carbocyclic ring, more preferably cyclohexane.

Each Cy may independently be unsubstituted or substituted with one or more substituents.

If present, substituents of Cy are optionally selected from substituents $R^3$ wherein $R^3$ in each occurrence is independently selected from alkyl, optionally $C_{1-20}$ alkyl, wherein one or more non-adjacent C atoms may be replaced with optionally substituted aryl or heteroaryl, O, S, substituted N, C=O or —COO—, and one or more H atoms may be replaced with F. $R^3$ is preferably $C_{1-20}$ alkyl. Preferably, Cy is substituted with at least one substituent $R^3$.

Optionally, Cy is a group of formula (III):

wherein z is 0, 1, 2, 3 or 4, preferably 0, 1 or 2.

Preferably, the bond between Cy and $Ar^1$ is substituted with a substituent $R^3$.

Preferably, the bond between Cy and N is substituted with a substituent $R^3$.

Optionally, each $Ar^1$ is independently a $C_{5-20}$ aryl group or a 5-20 membered heteroaryl group that may be unsubstituted or substituted with one or more substituents. Preferably, $Ar^1$ is phenyl that may be unsubstituted or substituted with one or more substituents.

Substituents of $Ar^1$, if present, are preferably selected from substituents $R^2$ described above.

Exemplary repeat units of formula (I) include the following:

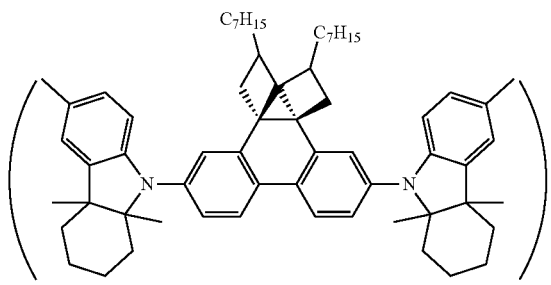

Optionally, the polymer comprising repeat units of formula (I) has a photoluminescence spectrum with a peak of less than or equal to 480 nm, optionally a peak in the range 400-480 nm.

Photoluminescence spectra as described herein may be measured by casting a film of the polymer onto a quartz substrate and measuring in a nitrogen environment using apparatus C9920-02 supplied by Hamamatsu.

The polymer may have a HOMO level in the range of 4.8-5.5 eV.

HOMO and LUMO levels may be measured by square wave voltammetry (SWV) in which the current at a working electrode is measured while the potential between the working electrode and a reference electrode is swept linearly in time. The difference current between a forward and reverse pulse is plotted as a function of potential to yield a voltammogram.

Apparatus for HOMO or LUMO energy level measurements by SWV comprise a CHI 660D Potentiostat; a 3 mm diameter glassy carbon working electrode; a leak free Ag/AgCl reference electrode; Pt wire counter electrode; and a cell containing 0.1M tetrabutylammonium hexafluorophosphate in acetonitrile Ferrocene is added directly to the cell at the end of the experiment for calculation purposes where the potentials are determined for the oxidation and reduction of ferrocene versus Ag/AgCl using cyclic voltammetry (CV)

The sample is dissolved in toluene (3 mg/ml) and spun at 3000 rpm directly on to the glassy carbon working electrode LUMO=4.8−E ferrocene (peak to peak average)−E reduction of sample (peak maximum)

HOMO=4.8−E ferrocene (peak to peak average)+E oxidation of sample (peak maximum)

The SWV experiment may be run at 15 Hz frequency; 25 mV amplitude and 0.004V increment steps under an Argon gas purge.

The polymer is preferably a conjugated polymer wherein repeat units of formula (I) are conjugated to adjacent repeat units. Preferably, an aromatic carbon atom of each $Ar^2$ of repeat units of formula (I) is directly bound to and conjugated with an $sp^2$-hybridised carbon atom of an adjacent repeat unit, preferably an aromatic carbon atom of an adjacent repeat unit.

The polymer may be a conjugated copolymer comprising repeat units of formula (I) and one or more co-repeat units. Exemplary co-repeat units include optionally substituted monocyclic and polycyclic arylene repeat units, preferably $C_{6-20}$ arylene repeat units and amine repeat units.

Exemplary arylene repeat units are disclosed in for example, Adv. Mater. 2000 12(23) 1737-1750, the contents of which are incorporated herein by reference. Arylene repeat units include, without limitation: 1,2-, 1,3- and 1,4-phenylene repeat units; 2,7-fluorene repeat units; indenofluorene repeat units; spirobifluorene repeat units; phenanthrene repeat units; dihydrophenanthrene repeat units; naphthalene repeat units; anthracene repeat units; and perylene repeat units. Each of these arylene repeat units may be linked to adjacent repeat units through any two of the aromatic carbon atoms of these units.

Each of these repeat units is optionally substituted. Optionally, substituents are selected from $C_{1-40}$ hydrocarbyl groups.

Arylene repeat units may be selected from formulae (VII)-(X):

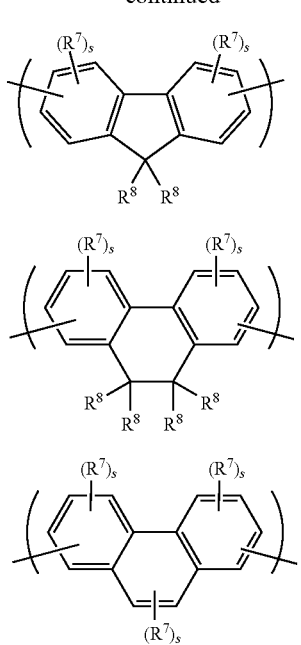

wherein t in each occurrence is independently 0, 1, 2, 3 or 4, preferably 1 or 2; $R^7$ independently in each occurrence is a substituent; s in each occurrence is independently 0, 1 or 2; and $R^8$ independently in each occurrence is a substituent wherein two $R^8$ groups may be linked to form an unsubstituted or substituted ring.

Where present, each $R^7$ and $R^8$ may independently in each occurrence be selected from the group consisting of:
- alkyl, optionally $C_{1-20}$ alkyl, wherein one or more non-adjacent C atoms may be replaced with optionally substituted aryl or heteroaryl, O, S, substituted N, C=O or —COO—, and one or more H atoms may be replaced with F;
- a group of formula —$(Ar^{12})$r wherein each $Ar^{12}$ is independently an aryl or heteroaryl group, preferably a $C_{6-20}$ aryl group, more preferably phenyl, and r is at least 1, optionally 1, 2 or 3.

In the case where $R^7$ or $R^8$ comprises an aryl or heteroaryl group, or a linear or branched chain of aryl or heteroaryl groups, the or each aryl or heteroaryl group may be substituted with one or more substituents $R^8$ selected from the group consisting of:
- alkyl, for example $C_{1-20}$ alkyl, wherein one or more non-adjacent C atoms may be replaced with O, S, substituted N, C=O and —COO— and one or more H atoms of the alkyl group may be replaced with F;
- $NR^9_2$, $OR^9$, $SR^9$, $SiR^9_3$ and
- fluorine, nitro and cyano;

wherein each $R^9$ is independently selected from the group consisting of alkyl, preferably $C_{1-20}$ alkyl; and aryl or heteroaryl, preferably phenyl, which may be unsubstituted or substituted with one or more $C_{1-20}$ alkyl groups.

Substituted N, where present, may be —$NR^{10}$— wherein $R^{10}$ is a substituent and is optionally a $C_{1-40}$ hydrocarbyl group, optionally a $C_{1-20}$ alkyl group.

Preferred substituents of aryl or heteroaryl groups of $R^7$ or $R^8$ are selected from $C_{1-20}$ alkyl.

In the case where two groups $R^8$ form a ring, the one or more substituents of the ring, if present, are optionally selected from $C_{1-20}$ alkyl groups.

In the case where r is 2 or more, —$(Ar^{12})$r, may form a branched or linear chain of $Ar^{12}$ groups, optionally biphenyl or 3,5-diphenylbenzene.

Preferably each $R^7$, where present, and $R^8$ is independently selected from $C_{1-40}$ hydrocarbyl. Preferred $C_{1-40}$ hydrocarbyl groups are $C_{1-20}$ alkyl; unsubstituted phenyl; phenyl substituted with one or more $C_{1-20}$ alkyl groups; and a linear or branched chain of phenyl groups, wherein each phenyl may be unsubstituted or substituted with one or more $C_{1-20}$ alkyl groups.

The polymer may comprise amine repeat units of formula (VI):

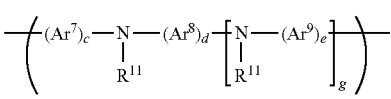

wherein $Ar^7$, $Ar^8$ and $Ar^9$ in each occurrence are independently selected from $C_{6-20}$ aryl group or a 5-20 membered heteroaryl group that may be unsubstituted or substituted with one or more substituents, $R^{11}$ is H or a substituent, preferably a substituent; c, d and e are each independently 1, 2 or 3; g is 0 or 1; $Ar^7$ and $Ar^8$ bound directly to the same N atom may be linked by a direct bond or a divalent group; or $Ar^8$ and $Ar^9$ bound directly to the same N atom may be linked by a direct bond or a divalent group.

In the case where $Ar^7$ and $Ar^8$ or $Ar^8$ and $Ar^9$ are bound by a divalent group, the divalent group is preferably O or S.

$R^{11}$ is preferably selected from the group consisting of alkyl, for example $C_{1-20}$ alkyl, or $(Ar^{10})$f wherein f is at least 1, optionally 1-3, and wherein $Ar^{10}$ in each occurrence is independently a $C_{6-20}$ aryl group or a 5-20 membered heteroaryl group aryl or heteroaryl group that may be unsubstituted or substituted with one or more substituents.

In the case where g=0, $Ar^7$ and $Ar^8$ are each preferably phenyl which may be unsubstituted or substituted with one or more substituents.

In the case where g=1, $Ar^7$ and $Ar^9$ are each preferably phenyl which may be unsubstituted or substituted with one or more substituents and $Ar^8$ is preferably a $C_{6-20}$ aryl group, optionally phenyl, which may be unsubstituted or substituted with one or more substituents.

If present, $Ar^{10}$ is preferably phenyl which may be unsubstituted or substituted with one or more substituents.

In the case where f is 2 or more, —$(Ar^{10})$f may form a branched or linear chain of $Ar^9$ groups.

Exemplary groups $(Ar^{10})$f include the following, each of which may be unsubstituted or substituted with one or more substituents:

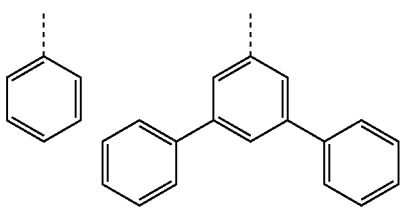

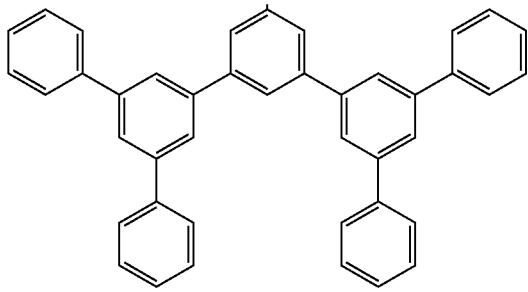

wherein — represents a bond to N of formula (VI).

Optionally, substituents of $Ar^7$, $Ar^8$ and, if present, $Ar^9$ and $Ar^{10}$ are selected from alkyl, optionally $C_{1-20}$ alkyl, wherein one or more non-adjacent C atoms may be replaced with optionally substituted aryl or heteroaryl, O, S, substituted N, C=O or —COO—, and one or more H atoms may be replaced with F.

Preferably, g is 0, c and d are each 1 and $Ar^7$ and $Ar^8$ are phenyl linked by an oxygen atom to form a phenoxazine ring.

Polymers as described herein including, without limitation, polymers comprising a repeat unit of formula (I) may have a polystyrene-equivalent number-average molecular weight (Mn) measured by gel permeation chromatography in the range of about $1\times10^3$ to $1\times10^8$, and preferably $1\times10^3$ to $5\times10^6$. The polystyrene-equivalent weight-average molecular weight (Mw) of the polymers described herein may be $1\times10^3$ to $1\times10^8$, and preferably $1\times10^4$ to $1\times10^7$.

Polymers as described herein including, without limitation, polymers comprising a repeat unit of formula (I) are preferably amorphous.

Polymer Synthesis

Preferred methods for preparation of conjugated polymers, such as homopolymer or copolymer comprising repeat units of formula (I) as described above, comprise a "metal insertion" wherein the metal atom of a metal complex catalyst is inserted between an aryl or heteroaryl group and a leaving group of a monomer. Exemplary metal insertion methods are Suzuki polymerisation as described in, for example, WO 00/53656 and Yamamoto polymerisation as described in, for example, T. Yamamoto, "Electrically Conducting And Thermally Stable pi-Conjugated Poly(arylene)s Prepared by Organometallic Processes", Progress in Polymer Science 1993, 17, 1153-1205. In the case of Yamamoto polymerisation, a nickel complex catalyst is used; in the case of Suzuki polymerisation, a palladium complex catalyst is used.

For example, in the synthesis of a linear polymer by Yamamoto polymerisation, a monomer having two reactive halogen groups is used. Similarly, according to the method of Suzuki polymerisation, at least one reactive group is a boron derivative group such as a boronic acid or boronic ester and the other reactive group is a halogen. Preferred halogens are chlorine, bromine and iodine, most preferably bromine.

It will therefore be appreciated that repeat units illustrated throughout this application may be derived from a monomer carrying suitable leaving groups. Likewise, an end-capping group or side group carrying only one reactive leaving group may be bound to the polymer by reaction of a leaving group at the polymer chain end or side respectively.

Suzuki polymerisation may be used to prepare regioregular, block and random copolymers. In particular, homopolymers or random copolymers may be prepared when one reactive group is a halogen and the other reactive group is a boron derivative group. Alternatively, block or regioregular copolymers may be prepared when both reactive groups of a first monomer are boron and both reactive groups of a second monomer are halogen.

As alternatives to halides, other leaving groups capable of participating in metal insertion include sulfonic acids and sulfonic acid esters such as tosylate, mesylate and triflate.

Light-emitting Layers

Suitable light-emitting materials for use in the light-emitting layer or layers of an OLED include small molecule, polymeric and dendrimeric materials, and compositions thereof. Suitable light-emitting polymers include conjugated polymers, for example substituted or unsubstituted poly (arylene vinylenes) such as poly(p-phenylene vinylenes) and substituted or unsubstituted polyarylenes such as: polyfluorenes, particularly 2,7-linked 9,9 dialkyl polyfluorenes or 2,7-linked 9,9 diaryl polyfluorenes; polyspirofluorenes, particularly 2,7-linked poly-9,9-spirofluorene; polyindenofluorenes, particularly 2,7-linked polyindenofluorenes; polyphenylenes, particularly alkyl or alkoxy substituted poly-1,4-phenylene. Such polymers as disclosed in, for example, Adv. Mater. 2000 12(23) 1737-1750 and references therein.

A polymer comprising a repeat unit of formula (I) as described above may be provided in a light emitting layer of an OLED, either as a light-emitting material or as a host for a fluorescent or phosphorescent dopant.

In the case where a light-emitting layer comprises a polymer comprising a repeat unit of formula (I), the light-emitting layer may consist of the polymer alone, or may comprise this material in combination with one or more further materials.

The one or more further materials may comprise a hole transporting material and/or an electron transporting materials, for example as disclosed in WO 99/48160, the contents of which are incorporated herein by reference.

In the case of a fluorescent light-emitting layer, optionally a light-emitting layer comprising a polymer comprising repeat units of formula (I) that fluoresces when the device is in use, the one or more further materials may comprise a triplet-accepting material, for example as disclosed in WO 2011/161424, the contents of which are incorporated herein by reference. The triplet-accepting material may have a lowest excited state triplet energy level lower than that of the light-emitting material to allow transfer to triplet excitons and a lowest excited state singlet energy level higher than that of the light-emitting material to avoid quenching or downconversion of fluorescence.

The OLED may contain one or more of red, green and blue light-emitting materials. Preferably, the polymer comprising a repeat unit of formula (I) emits blue light when in use.

A blue light-emitting material as described anywhere herein may have photoluminescent spectrum with a peak wavelength in the range of less than or equal to 480 nm, such as in the range of 400-480 nm A green light-emitting material as described anywhere herein may have photoluminescent spectrum with a peak wavelength in the range of above 480 nm-560 nm.

A red light-emitting material as described anywhere herein may have photoluminescent spectrum with a peak wavelength in the range of above 560 nm-630 nm.

More than one light-emitting material may be used. For example, red, green and blue light-emitting dopants may be used to obtain white light emission.

The light emitting layer may comprise a host material and at least one light-emitting dopant. The host material may be a material as described above that would, in the absence of a dopant, emit light itself, and may be a polymer comprising a repeat unit of formula (I) as described above. When a host material and dopant are used in a device, the dopant alone may emit light. Alternatively, the host material and one or more dopants may emit light. White light may be generated by emission from multiple light sources, such as emission from both the host and one or more dopants or emission from multiple dopants.

In the case of a fluorescent light-emitting dopant the singlet excited state energy level ($S_1$) of the host material should be higher than that of the fluorescent light-emitting dopant in order that singlet excitons may be transferred from the host material to the fluorescent light-emitting dopant. In the case of a phosphorescent light-emitting dopant the triplet excited state energy level ($T_1$) of the host material should be higher than that of the phosphorescent light-emitting dopant in order that triplet excitons may be transferred from the host material to the fluorescent light-emitting dopant.

The light-emitting dopant may be blended with the host material or it may be covalently bound to the host material.

More than one light-emitting layer may be present. Multiple light-emitting layers may together produce white light.

The light-emitting layer may be patterned or unpatterned. A device comprising an unpatterned layer may be used an illumination source, for example. A white light emitting device is particularly suitable for this purpose. A device comprising a patterned layer may be, for example, an active matrix display or a passive matrix display. In the case of an active matrix display, a patterned electroluminescent layer is typically used in combination with a patterned anode layer and an unpatterned cathode. In the case of a passive matrix display, the anode layer is formed of parallel stripes of anode material, and parallel stripes of electroluminescent material and cathode material arranged perpendicular to the anode material wherein the stripes of electroluminescent material and cathode material are typically separated by stripes of insulating material ("cathode separators") formed by photolithography.

Charge Transporting and Charge Blocking Layers

A hole transporting layer may be provided between the anode and the light-emitting layer or layers. Likewise, an electron transporting layer may be provided between the cathode and the light-emitting layer or layers.

Similarly, an electron blocking layer may be provided between the anode and the light-emitting layer and a hole blocking layer may be provided between the cathode and the light-emitting layer. Transporting and blocking layers may be used in combination. Depending on its HOMO and LUMO levels, a single layer may both transport one of holes and electrons and block the other of holes and electrons.

If present, a hole transporting layer located between the anode and the light-emitting layers preferably has a HOMO level of less than or equal to 5.5 eV, more preferably around 4.8-5.5 eV or 5.1-5.3 eV as measured by square wave voltammetry. The HOMO level of the hole transport layer may be selected so as to be within 0.2 eV, optionally within 0.1 eV, of an adjacent layer (such as a light-emitting layer) in order to provide a small barrier to hole transport between these layers.

If present, an electron transporting layer located between the light-emitting layers and cathode preferably has a LUMO level of around 2.4-3.5 eV from vacuum level as measured by square wave voltammetry. For example, a layer of a silicon monoxide or silicon dioxide or other thin dielectric layer having thickness in the range of 0.2-2 nm may be provided between the light-emitting layer nearest the cathode and the cathode. HOMO and LUMO levels may be measured using square wave voltammetry.

A hole transporting layer may contain a homopolymer or copolymer comprising a repeat unit of formula (I) as described above.

A hole-transporting layer may contain a homopolymer or copolymer comprising a repeat unit of formula (VI) as described above.

A hole-transporting copolymer may comprise one or more amine repeat units, optionally one or more repeat units selected from formulae (I) and/or (VI), and one or more further repeat units, optionally one or more unsubstituted or substituted arylene repeat units, optionally one or more repeat units selected from formulae (VII)-(X) as described above.

A charge-transporting layer or charge-blocking layer may be crosslinked, particularly if a layer overlying that charge-transporting or charge-blocking layer is deposited from a solution. The crosslinkable group used for this crosslinking may be a crosslinkable group comprising a reactive double bond such and a vinyl or acrylate group, or a benzocyclobutane group.

In the case of a hole-transporting polymer comprising a repeat unit of formula (VII)-(X), one or more substituents selected from $R^7$ and $R^8$ may be a crosslinkable group.

An electron transporting layer may contain a polymer comprising a chain of optionally substituted arylene repeat units, such as a chain of fluorene repeat units.

Hole Injection Layers

A conductive hole injection layer, which may be formed from a conductive organic or inorganic material, may be provided between the anode 2 and the light-emitting layer 3 illustrated in FIG. 1 to assist hole injection from the anode into the layer or layers of semiconducting polymer. Examples of doped organic hole injection materials include optionally substituted, doped poly(ethylene dioxythiophene) (PEDT), in particular PEDT doped with a charge-balancing polyacid such as polystyrene sulfonate (PSS) as disclosed in EP 0901176 and EP 0947123, polyacrylic acid or a fluorinated sulfonic acid, for example Nafion®; polyaniline as disclosed in U.S. Pat. Nos. 5,723,873 and 5,798,170; and optionally substituted polythiophene or poly(thienothiophene). Examples of conductive inorganic materials include transition metal oxides such as VOx MoOx and RuOx as disclosed in Journal of Physics D: Applied Physics (1996), 29(11), 2750-2753.

Cathode

The cathode is selected from materials that have a work function allowing injection of electrons into the light-emitting layer or layers. Other factors influence the selection of the cathode such as the possibility of adverse interactions between the cathode and the light-emitting materials. The cathode may consist of a single material such as a layer of aluminium. Alternatively, it may comprise a plurality of metals, for example a bilayer of a low workfunction material and a high workfunction material such as calcium and aluminium as disclosed in WO 98/10621. The cathode may contain a layer containing elemental barium, for example as disclosed in WO 98/57381, Appl. Phys. Lett. 2002, 81(4), 634 and WO 02/84759 or a layer containing elemental magnesium. The cathode may contain a thin (e.g. 1-5 nm thick) layer of metal compound between the light-emitting layer(s) of the OLED and one or more conductive layers of the cathode, such as one or more metal layers. Exemplary metal compounds include an oxide or fluoride of an alkali or alkali earth metal, to assist electron injection, for example lithium fluoride as disclosed in WO 00/48258; barium fluoride as disclosed in Appl. Phys. Lett. 2001, 79(5), 2001; and barium oxide. In order to provide efficient injection of electrons into the device, the cathode preferably has a workfunction of less than 3.5 eV, more preferably less than 3.2 eV, most preferably less than 3 eV. Work functions of metals can be found in, for example, Michaelson, J. Appl. Phys. 48(11), 4729, 1977.

The cathode may be opaque or transparent. Transparent cathodes are particularly advantageous for active matrix devices because emission through a transparent anode in such devices is at least partially blocked by drive circuitry located underneath the emissive pixels. A transparent cathode comprises a layer of an electron injecting material that is sufficiently thin to be transparent. Typically, the lateral conductivity of this layer will be low as a result of its thinness. In this case, the layer of electron injecting material is used in combination with a thicker layer of transparent conducting material such as indium tin oxide.

It will be appreciated that a transparent cathode device need not have a transparent anode (unless, of course, a fully transparent device is desired), and so the transparent anode used for bottom-emitting devices may be replaced or supplemented with a layer of reflective material such as a layer of aluminium. Examples of transparent cathode devices are disclosed in, for example, GB 2348316.

Encapsulation

Organic optoelectronic devices tend to be sensitive to moisture and oxygen. Accordingly, the substrate preferably has good barrier properties for prevention of ingress of moisture and oxygen into the device. The substrate is commonly glass, however alternative substrates may be used, in particular where flexibility of the device is desirable. For example, the substrate may comprise one or more plastic layers, for example a substrate of alternating plastic and dielectric barrier layers or a laminate of thin glass and plastic.

The device may be encapsulated with an encapsulant (not shown) to prevent ingress of moisture and oxygen. Suitable encapsulants include a sheet of glass, films having suitable barrier properties such as silicon dioxide, silicon monoxide, silicon nitride or alternating stacks of polymer and dielectric or an airtight container. In the case of a transparent cathode device, a transparent encapsulating layer such as silicon monoxide or silicon dioxide may be deposited to micron levels of thickness, although in one preferred embodiment the thickness of such a layer is in the range of 20-300 nm. A getter material for absorption of any atmospheric moisture and/or oxygen that may permeate through the substrate or encapsulant may be disposed between the substrate and the encapsulant.

Solution Processing

Suitable solvents for forming compositions of the polymer for solution processing include common organic solvents, including mono- or poly-alkylbenzenes such as toluene and xylene.

Exemplary solution deposition techniques for forming a light-emitting layer containing a compound of formula (I) include printing and coating techniques such spin-coating, dip-coating, roll-to-roll coating or roll-to-roll printing, doctor blade coating, slot die coating, gravure printing, screen printing and inkjet printing.

Coating methods, such as those described above, are particularly suitable for devices wherein patterning of the light-emitting layer or layers is unnecessary—for example for lighting applications or simple monochrome segmented displays.

Printing is particularly suitable for forming a patterned light-emitting layer. A device may be inkjet printed by providing a patterned layer over the first electrode and defining wells for printing. The patterned layer is preferably a layer of photoresist that is patterned to define wells as described in, for example, EP 0880303.

As an alternative to wells, the ink may be printed into channels defined within a patterned layer. In particular, the photoresist may be patterned to form channels which, unlike wells, extend over a plurality of pixels and which may be closed or open at the channel ends.

The same coating and printing methods may be used to form other layers of an OLED including (where present) a hole injection layer, a charge transporting layer and a charge blocking layer.

EXAMPLES

Monomer Example 1

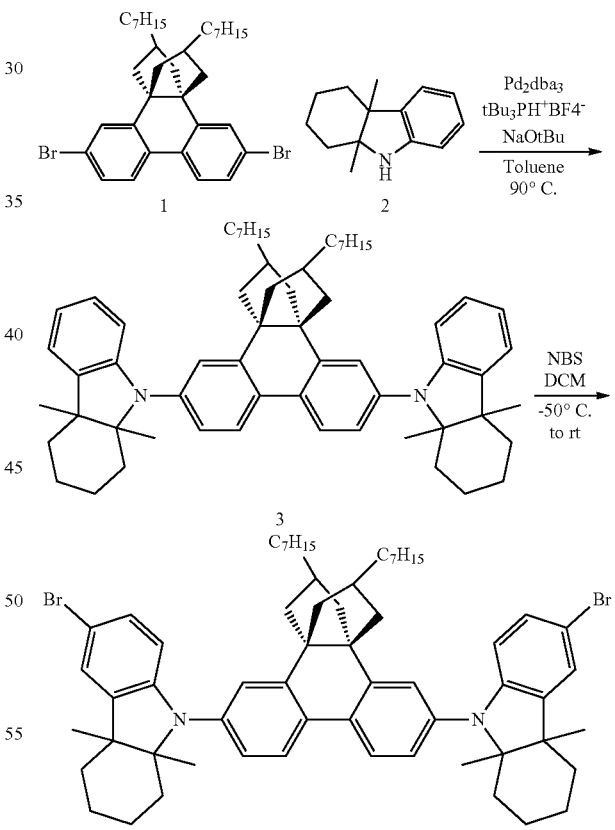

Monomer Example 1

Intermediate 3:

Nitrogen was bubbled into a solution of dibromide 1 (32 g, 0.0520 mol) and hydro-carbazole 2 (26.1 g, 0.1301 mol) in toluene (800 mL). Sodium tert-butoxide (19.98 g, 0.208 mol) was added to it, followed by tri-tert-butylphosphonium tetrafluoroborate (0.29 g, 0.001 mol) and tris-dibenzylidine acetone dipalladium (0.951 g, 0.001 mol). Nitrogen was bubbled into the mixture for 50 minutes. The reaction mixture was then stirred at 90° C. for 16 hours. The reaction mixture was cooled to room temperature, diluted with n-hexane (1 L) and stirred for 1 hour. Mixture was filtered through a celite plug and washed with n-hexane (500 mL). The filtrate was concentrated and purified by a flash column chromatography over silica using 1.2% diethyl ether in hexane as eluent to yield 22 g of Intermediate 3 at 99.3% purity by HPLC as a mixture of isomers and 17 g at 98.57% purity by HPLC as a mixture of isomers, 87.56% yield.

$^1$H-NMR (400 MHz, CDCl$_3$): δ [ppm] 0.89 (t, 6H), 1.12 (s, 6H), 1.21 (m, 16H), 1.26 (s, 6H), 1.28 (m, 4H), 1.30 (m, 4H), 1.53 (m, 8H), 1.64 (m, 6H), 1.75 (m, 6H), 1.96 (m, 2H), 2.28 (m, 4H), 6.6 (d, J=7.2 Hz, 2H), 6.7 (t, J=6.8 Hz, 2H), 7.01 (t, J=7.2 Hz, 2H), 7.1 (d, J=8.4 Hz, 2H), 7.17 (s, J=8.40 Hz, 2H), 7.36 (s, 2H), 7.84 (d, J=8.0 Hz, 2H).

Monomer Example 1:

Intermediate 3 (19 g, 0.0222 mol) was dissolved dichloromethane (500 mL) and cooled to −50° C. N-bromosuccinimide (7.86 g, 0.0442 mol) was added portion wise over 100 minutes. The reaction mixture was then stirred at −50° C. for 30 min and quenched by the addition of 5% solution of sodium sulfite (200 mL) at −50° C. Mixture was allowed warm up to room temperature slowly. The organic layer was separated and aqueous layer was extracted with dichloromethane (500 mL). Combined organic layers were washed with water (500 mL), brine (500 mL), dried over Na$_2$SO$_4$ and concentrated under reduced pressure. The crude product recrystallised twice from isopropanol/n-hexane. Product was purified by a flash column chromatography over silica gel using hexane as eluent to obtain 1.7 g of Monomer Example 1 at 99.66% purity by HPLC, 3.3 g at 99.92% purity by HPLC and 5.9 g at 99.71% purity by HPLC, all fraction as a mixture of isomers. (Yield=48.5%)

$^1$H-NMR (400 MHz, CDCl$_3$): δ [ppm] 0.9 (t, 6H), 1.14 (s, 6H), 1.23 (m, 16H), 1.25 (s, 6H), 1.3 (m, 4H), 1.32 (m, 4H), 1.53 (m, 8H), 1.64 (m, 6H), 1.75 (m, 6H), 1.96 (m, 2H), 2.3 (m, 4H), 6.4 (s, 2H), 7.13 (m, 6H), 7.28 (d, J=12.8 Hz, 2H), 7.8 (s, 2H).

Polymer Example 1

Polymer Example 1 was prepared by Suzuki polymerisation as described in WO 00/53656 of Monomer Example 1 (4 mol %) with 50 mol % of fluorene-2,7-diboronic ester monomers for forming repeat units of formula (VIII), 21 mol % of 2,7-dibromofluorene monomers for forming repeat units of formula (VIII) and 25 mol % of dibromo-monomers for forming repeat units of formula (X).

Comparative Polymer 1

Comparative Polymer 1 was prepared as described with respect to Polymer Example 1 except that Comparative Monomer 1 was used in place of Monomer Example 1.

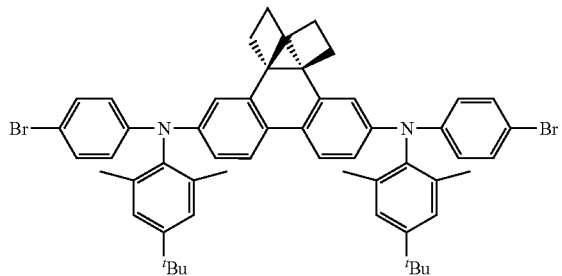

Comparative Monomer 1

Polymer Example 2

Polymer Example 2 was prepared by Suzuki polymerisation as described in WO 00/53656 of Monomer Example 1 (4 mol %) with 50 mol % of fluorene-2,7-diboronic ester monomers for forming repeat units of formula (VIII), 20 mol % of 2,7-dibromofluorene monomers for forming repeat units of formula (VIII), 25 mol % of dibromo-monomers for forming repeat units of formula (X) and 1 mol % of repeat units of formula:

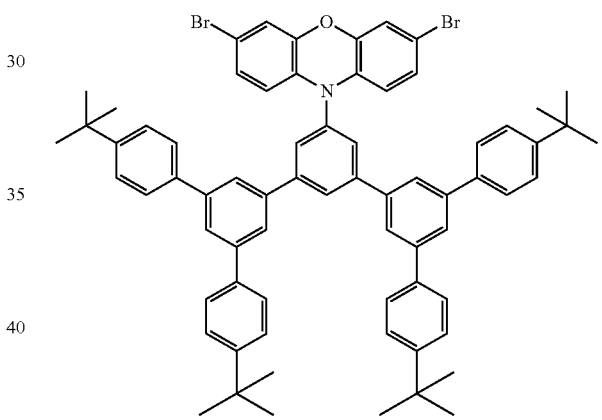

Comparative Polymer 2

This is copied from comparative polymer 1 and may need updating.

Comparative Polymer 1 was prepared as described with respect to Polymer Example 1 except that Comparative Monomer 1 was used in place of Monomer Example 1.

Photoluminescence Results

Polymer films were formed on quartz disks by spin coating to achieve transmittance values of 0.3-0.4. Measurements were performed under nitrogen in an integrating sphere connected to Hamamatsu C9920-02 with Mercury lamp E7536 and a monochromator for choice of exact wavelength. Results are set out in Table 1.

TABLE 1

| Polymer | PLQY (%) | CIE(x) | CIE(y) |
| --- | --- | --- | --- |
| Polymer Example 1 | 69.5 | 0.15 | 0.09 |
| Comparative Polymer 1 | 78.9 | 0.149 | 0.092 |
| Polymer Example 2 | 69.9 | 0.146 | 0.123 |
| Comparative Polymer 2 | 74.7 | 0.146 | 0.125 |

Device Examples

A device having the following structure was prepared:
ITO/HIL (35 nm)/HTL (22 nm)/LEL (61 nm)/Cathode
in which ITO is an indium tin oxide anode; HIL is a hole-injection layer; HTL is a hole-transporting layer; and LEL is a light-emitting layer.

To form the device, a substrate carrying ITO was cleaned using UV/Ozone. The hole injection layer was formed by spin-coating an aqueous formulation of a hole-injection material available from Nissan Chemical Industries and heating the resultant layer. The hole transporting layer was formed by spin-coating Hole-Transporting Polymer 1 and crosslinking the polymer by heating. The light-emitting layer was formed by spin-coating a solution comprising Polymer Example 2 or Comparative Polymer 2. The cathode was formed by evaporation of a first layer of sodium fluoride to a thickness of about 2 nm, a second layer of aluminium to a thickness of about 100 nm. Following formation of the cathode the device was heated at 80° C. for 1 hour.

Hole-Transporting Polymer 1 was formed by Suzuki polymerisation as described in WO 00/53656 of a phenylene repeat unit of formula (VII), an amine repeat unit of formula (VI) and crosslinkable repeat units of formula (VIII).

Figure 2:
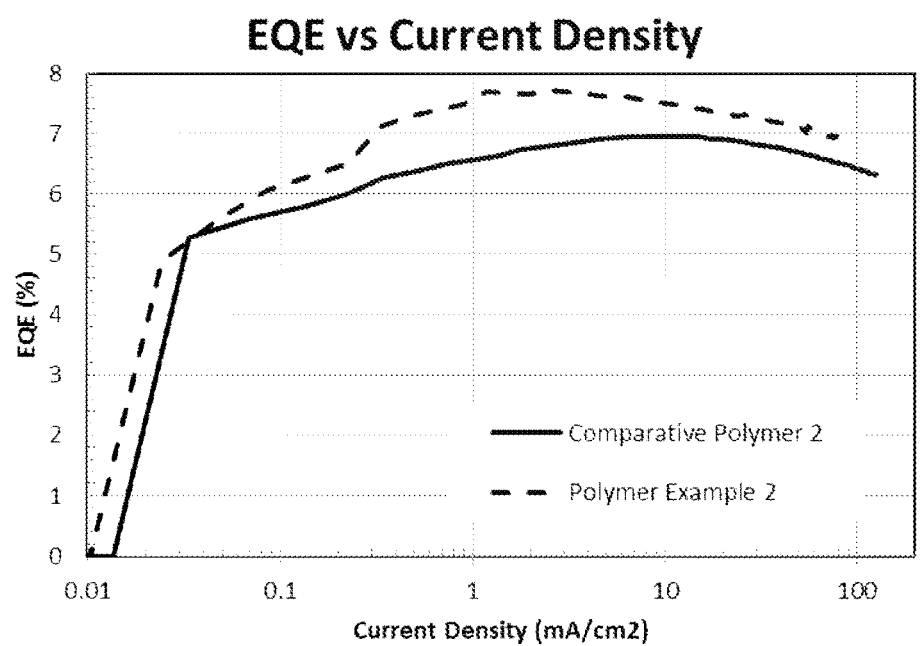
FIG. 2 is a graph of external quantum efficiency vs. current density for a device according to an embodiment of the invention.

With reference to FIG. 2, efficiency of the device comprising Polymer Example 2 is higher than that of the device comprising Comparative Polymer 2.

Although the present invention has been described in terms of specific exemplary embodiments, it will be appreciated that various modifications, alterations and/or combinations of features disclosed herein will be apparent to those skilled in the art without departing from the scope of the invention as set forth in the following claims.

The invention claimed is:

1. A polymer comprising a repeat unit of formula (I):

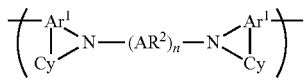

wherein each $Ar^1$ and each $Ar^2$ independently represents a substituted or unsubstituted aromatic or heteroaromatic group; each Cy independently represents a saturated heterocyclic or carbocyclic ring that may be unsubstituted or substituted with one or more substituents; n is 1, 2 or 3; and adjacent groups $Ar^2$ may be linked by a divalent linking group in the case where n is 2 or 3.

2. A polymer according to claim 1 wherein the divalent linking group is selected from $C_{1-10}$ alkylene; and a saturated monocyclic or polycyclic carbocyclic ring that may be unsubstituted or substituted with one or more substituents.

3. A polymer according to claim 1 wherein n is 2.

4. A polymer according to claim 2 wherein —$(Ar^2)n$— is a group of formula (II) that may be unsubstituted or substituted with one or more substituents:

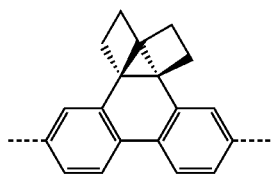

wherein — represents a bond to N of formula (I).

5. A polymer according to claim 1 wherein each $Ar^2$ is independently phenyl that may be unsubstituted or substituted with one or more substituents.

6. A polymer according to claim 1 wherein Cy is a saturated carbocyclic ring.

7. A polymer according to claim 6 wherein Cy is cyclohexane.

8. A polymer according to claim 1 wherein $Ar^1$ is unsubstituted or substituted phenyl.

9. A polymer according to claim 1 wherein the polymer has a photoluminescence spectrum with a peak of less than or equal to 480 nm.

10. A polymer according to claim 1 comprising one or more co-repeat units.

11. A polymer according to claim 10 wherein the repeat units of formula (I) form 0.5-25 mol % of repeat units of the polymer.

12. A polymer according to claim 10 wherein the co-repeat units comprise one or more $C_{6-20}$ arylene co-repeat units that may each independently be unsubstituted or substituted with one or more substituents.

13. A monomer of formula (III):

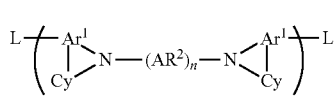

wherein each $Ar^1$ and each $Ar^2$ independently represents a substituted or unsubstituted aromatic or heteroaromatic group; each Cy independently represents a saturated heterocyclic or carbocyclic ring that may be unsubstituted or substituted with one or more substituents; n is 1, 2 or 3; and adjacent groups $Ar^2$ may be linked by a divalent linking group in the case where n is 2 or 3, and each L represents a reactive leaving group.

14. A monomer according to claim 13 wherein each L is independently selected from the group consisting of halogen; boronic acids and esters thereof; and sulfonic acid esters.

15. A method of forming a polymer comprising the step of polymerising a monomer according to claim 13.

16. An organic electronic device comprising a semiconductor layer wherein the semiconductor layer comprises a polymer according to claim 1.

17. An organic electronic device according to claim 16 wherein the device is an organic light-emitting device comprising the semiconductor layer between an anode and a cathode.

18. An organic electronic device according to claim 17 wherein the semiconductor layer is a light-emitting layer.

19. A formulation comprising a polymer according to claim 1 and at least one solvent.

20. A method of forming an organic electronic device according to claim 16, the method comprising the step of forming the semiconducting layer by depositing a formulation comprising the polymer and at least one solvent, and evaporating the at least one solvent.

* * * * *